(12) United States Patent
Rotbard et al.

(10) Patent No.: US 8,374,014 B2
(45) Date of Patent: Feb. 12, 2013

(54) REJUVENATION OF ANALOG MEMORY CELLS

(75) Inventors: Barak Rotbard, Tel Aviv (IL); Naftali Sommer, Rishon Lezion (IL); Shai Winter, Giva'ataim (IL); Ofir Shalvi, Ra'anana (IL); Dotan Sokolov, Ra'anana (IL); Or Ordentlich, Tel Aviv (IL); Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/284,913

(22) Filed: Oct. 30, 2011

(65) Prior Publication Data

US 2012/0044762 A1 Feb. 23, 2012

Related U.S. Application Data

(62) Division of application No. 12/649,382, filed on Dec. 30, 2009, now Pat. No. 8,248,831.

(60) Provisional application No. 61/141,842, filed on Dec. 31, 2008, provisional application No. 61/234,688, filed on Aug. 18, 2009, provisional application No.

(Continued)

(51) Int. Cl.
*G11C 27/00* (2006.01)
(52) U.S. Cl. ................................ 365/45; 365/185.18
(58) Field of Classification Search ............ 365/45, 365/185.18, 185.09
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,608,687 A | 8/1986 | Dutton | |
| 4,654,847 A | 3/1987 | Dutton | |
| 5,182,558 A | 1/1993 | Mayo | |
| 5,182,752 A | 1/1993 | DeRoo et al. | |
| 5,450,424 A | 9/1995 | Okugaki et al. | |
| 5,469,444 A | 11/1995 | Endoh et al. | |
| 5,533,190 A | 7/1996 | Binford et al. | |
| 5,799,200 A | 8/1998 | Brant et al. | |
| 6,259,627 B1 | 7/2001 | Wong | |
| 6,278,632 B1 | 8/2001 | Chevallier | |
| 6,314,044 B1 | 11/2001 | Sasaki et al. | |
| 6,405,342 B1 | 6/2002 | Lee | |
| 6,445,602 B1 | 9/2002 | Kokudo et al. | |
| 6,480,948 B1 | 11/2002 | Virajpet et al. | |

(Continued)

OTHER PUBLICATIONS

U.S. Appl. No. 12/323,544 Official Action dated Mar. 9, 2012.

(Continued)

*Primary Examiner* — Huan Hoang
(74) *Attorney, Agent, or Firm* — Meyertons, Hood, Kivlin, Kowert & Goetzel, P.C.

(57) ABSTRACT

A method for data storage in a memory that includes multiple analog memory cells fabricated using respective physical media, includes identifying a group of the memory cells whose physical media have deteriorated over time below a given storage quality level. A rejuvenation process, which causes the physical media of the memory cells in the group to meet the given storage quality level, is applied to the identified group. Data is stored in the rejuvenated group of the memory cells.

18 Claims, 3 Drawing Sheets

Related U.S. Application Data

61/243,726, filed on Sep. 18, 2009, provisional application No. 61/244,500, filed on Sep. 22, 2009, provisional application No. 61/251,787, filed on Oct. 15, 2009.

(56) References Cited

U.S. PATENT DOCUMENTS

| | | |
|---|---|---|
| 6,490,236 B1 | 12/2002 | Fukuda et al. |
| 6,640,326 B1 | 10/2003 | Buckingham et al. |
| 6,732,250 B2 | 5/2004 | Durrant |
| 6,804,805 B2 | 10/2004 | Rub |
| 6,819,592 B2 | 11/2004 | Noguchi et al. |
| 6,851,081 B2 | 2/2005 | Yamamoto |
| 6,925,009 B2 | 8/2005 | Noguchi et al. |
| 7,006,379 B2 | 2/2006 | Noguchi et al. |
| 7,158,058 B1 | 1/2007 | Yu |
| 7,196,644 B1 | 3/2007 | Anderson et al. |
| 7,196,933 B2 | 3/2007 | Shibata |
| 7,210,077 B2 | 4/2007 | Brandenberger et al. |
| 7,254,763 B2 | 8/2007 | Aadsen et al. |
| 7,266,069 B2 | 9/2007 | Chu |
| 7,272,757 B2 | 9/2007 | Stocken |
| 7,280,415 B2 | 10/2007 | Hwang et al. |
| 7,310,269 B2 | 12/2007 | Shibata |
| 7,310,272 B1 | 12/2007 | Mokhesi et al. |
| 7,312,727 B1 | 12/2007 | Feng et al. |
| 7,328,384 B1 | 2/2008 | Kulkarni et al. |
| 7,343,330 B1 | 3/2008 | Boesjes et al. |
| 7,365,671 B1 | 4/2008 | Anderson |
| 7,405,974 B2 | 7/2008 | Yaoi et al. |
| 7,409,623 B2 | 8/2008 | Baker et al. |
| 7,433,697 B2 | 10/2008 | Karaoguz et al. |
| 7,434,111 B2 | 10/2008 | Sugiura et al. |
| 7,440,331 B2 | 10/2008 | Hemink |
| 7,447,970 B2 | 11/2008 | Wu et al. |
| 7,450,421 B2 | 11/2008 | Mokhesi et al. |
| 7,457,163 B2 | 11/2008 | Hemink |
| 7,457,897 B1 | 11/2008 | Lee et al. |
| 7,469,049 B1 | 12/2008 | Feng |
| 7,483,319 B2 | 1/2009 | Brown |
| 7,487,394 B2 | 2/2009 | Forhan et al. |
| 7,526,711 B2 | 4/2009 | Orio |
| 7,558,109 B2 | 7/2009 | Brandman et al. |
| 7,558,839 B1 | 7/2009 | McGovern |
| 7,574,555 B2 | 8/2009 | Porat et al. |
| 7,590,002 B2 | 9/2009 | Mokhlesi et al. |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,639,532 B2 | 12/2009 | Roohparvar et al. |
| 7,644,347 B2 | 1/2010 | Alexander et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,733,712 B1 | 6/2010 | Walston et al. |
| 7,797,609 B2 | 9/2010 | Neuman |
| 7,904,783 B2 | 3/2011 | Brandman et al. |
| 7,929,549 B1 | 4/2011 | Talbot |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,060,806 B2 * | 11/2011 | Shalvi et al. ................. 714/763 |
| 8,065,583 B2 | 11/2011 | Radke |
| 2002/0056064 A1 | 5/2002 | Kidorf et al. |
| 2002/0166091 A1 | 11/2002 | Kidorf et al. |
| 2005/0030788 A1 | 2/2005 | Parkinson et al. |
| 2005/0144361 A1 | 6/2005 | Gonzalez et al. |
| 2006/0106972 A1 | 5/2006 | Gorobets et al. |
| 2007/0104211 A1 | 5/2007 | Opsasnick |
| 2008/0123426 A1 | 5/2008 | Lutze et al. |
| 2009/0193184 A1 | 7/2009 | Yu et al. |
| 2010/0082883 A1 | 4/2010 | Chen et al. |
| 2010/0131826 A1 * | 5/2010 | Shalvi et al. ................. 714/763 |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0149657 A1 | 6/2011 | Haratsch et al. |
| 2011/0302354 A1 | 12/2011 | Miller |

OTHER PUBLICATIONS

Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 13/338,335, filed Dec. 28, 2011.
U.S. Appl. No. 13/355,536, filed Jan. 22, 2012.

* cited by examiner

REJUVENATION OF ANALOG MEMORY CELLS

CROSS-REFERENCE TO RELATED APPLICATIONS

This application is a divisional of U.S. patent application Ser. No. 12/649,382, filed Dec. 30, 2009, which claims the benefit of U.S. Provisional Patent Application 61/141,842, filed Dec. 31, 2008, U.S. Provisional Patent Application 61/234,68, filed Aug. 18, 2009, U.S. Provisional Patent Application 61/243,726, filed Sep. 18, 2009, U.S. Provisional Patent Application 61/244,500, filed Sep. 22, 2009, and U.S. Provisional Patent Application 61/251,787, filed Oct. 15, 2009. The disclosures of all these related applications are incorporated herein by reference.

FIELD OF THE INVENTION

The present invention relates generally to memory devices, and particularly to methods and systems for rejuvenating analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume either of two possible programming levels. Higher-density devices, often referred to as Multi-Level Cell (MLC) devices, store two or more bits per memory cell, i.e., can be programmed to assume more than two possible programming levels.

SUMMARY OF THE INVENTION

An embodiment of the present invention provides a method for data storage, including:

in a memory that includes multiple analog memory cells fabricated using respective physical media, identifying a group of the memory cells whose physical media have deteriorated over time below a given storage quality level;

applying to the identified group a rejuvenation process, which causes the physical media of the memory cells in the group to meet the given storage quality level; and storing data in the rejuvenated group of the memory cells.

In an embodiment, applying the rejuvenation process includes causing removal of electrical charge that is trapped in the physical media of the memory cells in the group. In a disclosed embodiment, applying the rejuvenation process includes inhibiting programming of the memory cells in the group for a given time period.

In some embodiments, applying the rejuvenation process includes heating the memory cells in the group.

Heating the memory cells may include activating a heating device that is thermally coupled to the group of the memory cells. Alternatively, heating the memory cells may include applying memory access operations to some of the memory cells in the memory. Further alternatively, heating the memory cells may include preventing heat removal from the group. In an alternative embodiment, heating the memory cells includes directing to the memory cells in the group heat generated by another component that is not part of the group.

In another embodiment, applying the rejuvenation process includes attempting to erase or program the memory cells in the group. In yet another embodiment, applying the rejuvenation process includes copying the data from the group to an alternative location in the memory before rejuvenating the group. In a disclosed embodiment, applying the rejuvenation process includes heating the memory cells in the group while periodically refreshing the data stored in the memory cells in the group. Periodically refreshing the data may include refreshing the data during the rejuvenation process at a rate that is higher than a nominal refresh rate used for refreshing the data in the memory.

In some embodiments, identifying the group includes programming respective storage values into the memory cells in the group, measuring a shift that develops in the programmed storage values over a predefined time period, and determining, based on the measured shift, that the physical media have deteriorated below the given storage quality level. In an embodiment, the method includes copying the data from the group to another group of memory cells before programming the respective storage values into the memory cells in the group.

In some embodiments, identifying the group includes making a prediction that the physical media of the group of the memory cells is expected to deteriorate below the given storage quality level, so as to apply the rejuvenation process responsively to the prediction. In an embodiment, making the prediction includes estimating an integral of a temperature of the memory cells in the group over time, and initiating the rejuvenation process responsively to the integral. In another embodiment, making the prediction includes estimating one or more statistical properties of analog values stored in the memory cells in the group, and initiating the rejuvenation process responsively to the estimated statistical properties. Estimating the statistical properties may include predicting a number of errors in the group of the memory cells based on the statistical properties.

There is additionally provided, in accordance with an embodiment of the present invention, apparatus for data storage, including:

an interface for communicating with a memory that includes multiple analog memory cells fabricated using respective physical media; and circuitry, which is configured to identify a group of the memory cells whose physical media have deteriorated over time below a given storage quality level, to apply to the identified group a rejuvenation process, which causes the physical media of the memory cells in the group to meet the given storage quality level, and to store data in the rejuvenated group of the memory cells.

There is also provided, in accordance with an embodiment of the present invention, a method for data storage, including:

in a memory that includes multiple analog memory cells, storing data in a group of the analog memory cells by writing respective storage values into the memory cells in the group;

estimating an integral of a temperature of the memory cells in the group over time;

setting at least one read threshold for reading the memory cells in the group responsively to the estimated integral; and reading the analog storage values from the memory cells in the group using the at least one read threshold, so as to reconstruct the stored data.

There is further provided, in accordance with an embodiment of the present invention, apparatus for data storage, including:

an interface for communicating with a memory that includes multiple analog memory cells; and circuitry, which is configured to store data in a group of the analog memory cells by writing respective storage values into the memory cells in the group, to estimate an integral of a temperature of the memory cells in the group over time, to set at least one read threshold for reading the memory cells in the group responsively to the estimated integral, and to read the analog storage values from the memory cells in the group using the at least one read threshold, so as to reconstruct the stored data.

There is additionally provided, in accordance with an embodiment of the present invention, a method for data storage, including:

operating a memory, which includes a plurality of analog memory cells and generates internal heat;

heating at least some of the memory cells by applying to the memory external heat, in addition to the internal heat generated by the memory; and storing data in the heated memory cells.

The present invention will be more fully understood from the following detailed description of the embodiments thereof, taken together with the drawings in which:

DETAILED DESCRIPTION OF EMBODIMENTS

Overview

Figure 1:
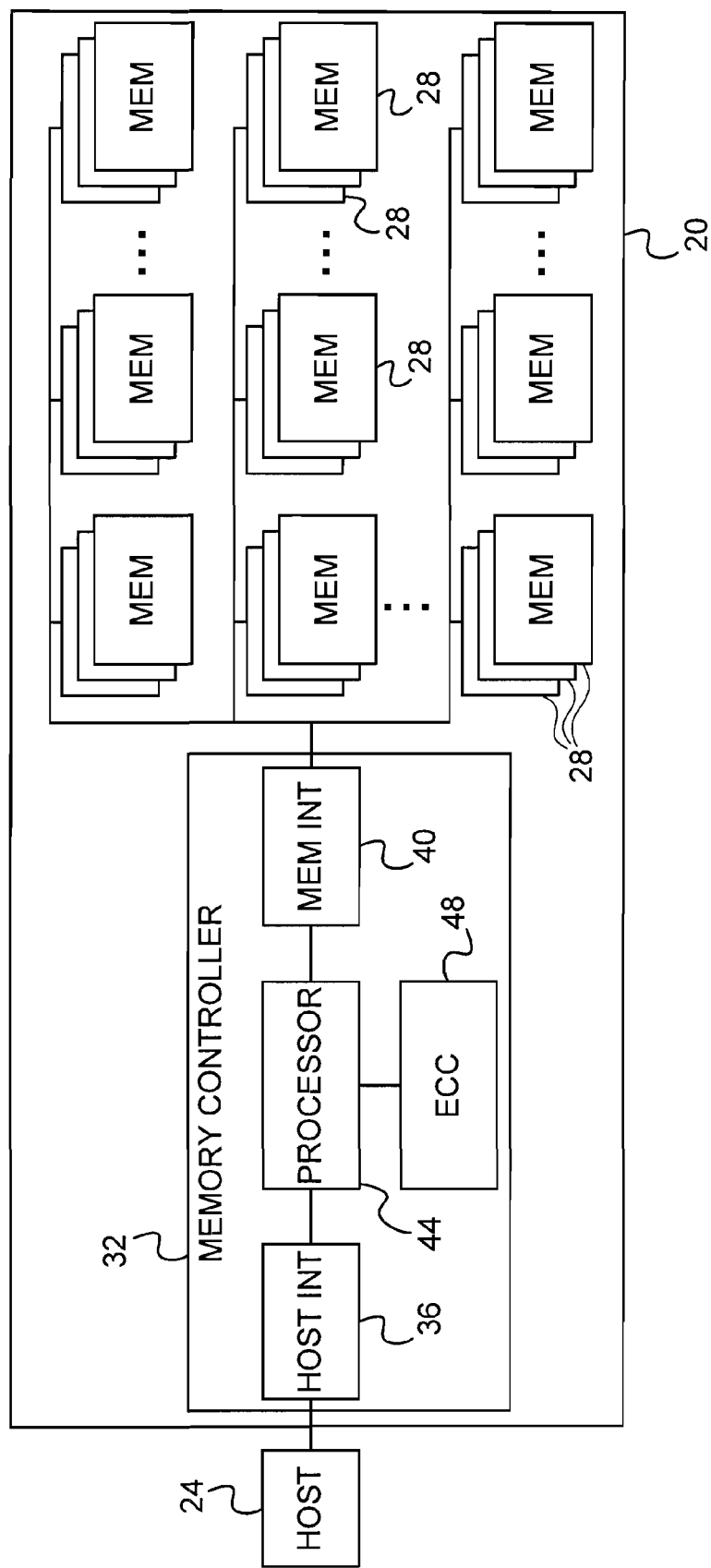
FIG. 1 is a block diagram that schematically illustrates a memory system, in accordance with an embodiment of the present invention.

Analog memory cells of a certain type are fabricated using certain physical media. For example, NAND Flash memory cells are typically implemented using floating-gate transistors that are disposed on a semiconductor substrate. Other types of non-volatile memory cells are implemented using other semiconductor configurations. Extensive use of analog memory cells sometimes causes aging effects in the cells' physical memory media, which causes the storage quality of the memory cells to deteriorate. In NAND Flash memory cells, for example, charge trapping in the boundary regions between memory cells decreases floating gate isolation, and may cause read errors and increase the memory cells' sensitivity to interference and charge loss. In known memory management schemes, when the deterioration of the physical memory media in a given group of memory cells becomes intolerable, the group is marked as faulty and taken out of service. Thus, the available storage capacity of a memory device decreases over time, and at some point drops below its specified capacity.

Embodiments of the present invention that are described hereinbelow provide improved methods and systems for managing memory devices comprising analog memory cells. The disclosed methods and systems apply various rejuvenation processes to memory cells whose physical memory media have deteriorated below a tolerable level. Rejuvenation may involve, for example, heating the memory cells or inhibiting programming of the memory cells for certain time periods. The techniques described herein return the storage quality of the rejuvenated memory cells to a tolerable level, so that the memory cells can be put back in service. Rejuvenation can be applied at different granularities, such as to individual groups of memory cells in a semiconductor die, individual dies within a multi-die memory device, individual memory devices within a multi-device assembly, or even individual memory assemblies (e.g., solid state disks) in a storage system. Several examples of memory management schemes that use rejuvenation processes are also described below.

In order to understand the disclosed techniques, it is important to differentiate between (1) deterioration of the physical memory media of the memory cells and (2) distortion or impairments in the analog values stored in the memory cells. It is similarly important to distinguish between (1) rejuvenation of the physical memory media of the memory cells and (2) refreshing of the analog values stored in the memory cells. The methods and systems described herein are concerned with repairing the deterioration of the physical memory media (e.g., eliminate charge traps in the oxide between and/or below the memory cells), irrespective of analog values or data that may be stored in the memory cells. Impairments in the analog values that represent the data stored in the memory cells, e.g., cell charge levels or threshold voltages, can be corrected by other means, which are beyond the scope of the present disclosure.

When using the disclosed rejuvenation techniques, memory cell groups that would otherwise be declared irreversibly faulty can continue to store data reliably. As a result, the overall storage capacity of a memory system or device decreases over time at a slower rate, and its effective lifetime is thus extended. Moreover, the disclosed techniques enable the design of memory systems and devices with less spare capacity, and therefore the size and cost of memory systems and devices can be reduced.

System Description

FIG. 1 is a block diagram that schematically illustrates a multi-device memory system 20, in accordance with an embodiment of the present invention. System 20 accepts data for storage from a host 24 and stores it in memory, and retrieves data from memory and provides it to the host. In the present example, system comprises a Solid-State Disk (SSD) that stores data for a host computer. In alternative embodiments, however, system 20 may be used in any other suitable application and with any other suitable host, such as in computing devices, cellular phones or other communication terminals, removable memory modules such as Disk-On-Key (DOK) devices, Secure Digital (SD) cards, Multi-Media Cards (MMC) and embedded MMC (eMMC), digital cameras, music and other media players and/or any other system or device in which data is stored and retrieved.

System 20 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory— PCM), Nitride Read Only Memory (NROM), Ferroelectric RAM (FRAM), magnetic RAM (MRAM) and/or Dynamic RAM (DRAM) cells, can also be used.

In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The memory cells are typically arranged in rows and columns. Typically, a given memory device comprises multiple erasure blocks (also referred to as memory blocks), i.e., groups of memory cells that are erased together.

Each memory device 28 may comprise a packaged device or an unpackaged semiconductor chip or die. A typical SSD may comprise a number of 4 GB devices. Generally, however, system 20 may comprise any suitable number of memory devices of any desired type and size. Although the system configuration of FIG. 1 comprises multiple memory devices, some of the methods and systems described herein can also be used in systems having only a single memory device.

System 20 comprises a memory controller 32, which accepts data from host 24 and stores it in memory devices 28, and retrieves data from the memory devices and provides it to the host. Memory controller 32 comprises a host interface 36 for communicating with host 24, a memory interface 40 for communicating with memory devices 28, and a processor 44 that processes the stored and retrieved data. In some embodiments, controller 32 encodes the stored data with an Error Correction Code (ECC). In these embodiments, controller 32 comprises an ECC unit 48, which encodes the data before stored in devices 28 and decodes the ECC of data retrieved from devices 28. The functions of processor 44 can be implemented, for example, using software running on a suitable Central Processing Unit (CPU), using hardware (e.g., state machine or other logic), or using a combination of software and hardware elements.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and Memory controller 32 may be fabricated on the same die, or on separate dies in the same device package.

Automatic Rejuvenation of Analog Memory Cells

The analog memory cells in memory devices 28 are fabricated using certain physical media. In the present example, devices 28 comprise NAND Flash devices, and the analog memory cells comprise floating-gate transistors that are disposed on a semiconductor substrate. In alternative embodiments, memory devices 28 may comprise any other type of analog memory cells, which are implemented using any other suitable physical media.

The physical memory media of the analog memory cells is typically specified and designed to provide a certain level of storage quality. The storage quality can be defined in any suitable way, such as the number of errors found per page during read operation, the maximal retention time during which that the data hold, or using any other suitable quality metric. In practice, however, the storage quality level often deteriorates with continued use of the memory cells. This deterioration is sometimes referred to as cell wearing or aging. In NAND Flash memory cells, for example, charge traps are gradually formed in the boundary regions between the memory cells (sometimes referred to as inter-cell oxide) and/or in the oxide that isolates the floating gate from the device channel (sometimes referred to as bottom oxide or tunnel oxide). The charge traps decrease the isolation of the cells' floating gates, and as a result the memory cells become more sensitive to interference (e.g., disturb noise) and charge loss. Other physical media types used in other memory cell types suffer from other kinds of storage quality deterioration.

At some point in time, the storage reliability of a certain group of memory cells may drop below a certain tolerable level, and the cell group may be regarded as unsuitable for storing data. In known memory management schemes, when the deterioration of the physical memory media in a given group of memory cells becomes intolerable, the group is typically marked as faulty and taken out of service. Thus, the available storage capacity of a memory device decreases over time, and at some point drops below its specified capacity.

Embodiments of the present invention provide methods and systems that automatically rejuvenate the physical memory media of analog memory cells in device 28. The rejuvenation methods described herein improve the storage reliability of the physical media, bringing it back to a tolerable level. Once rejuvenated, a group of memory cells can be put back in service and used for subsequent data storage. As a result, the overall storage capacity of system 20 decreases at slower rate, and its effective lifetime is extended.

Figure 2:
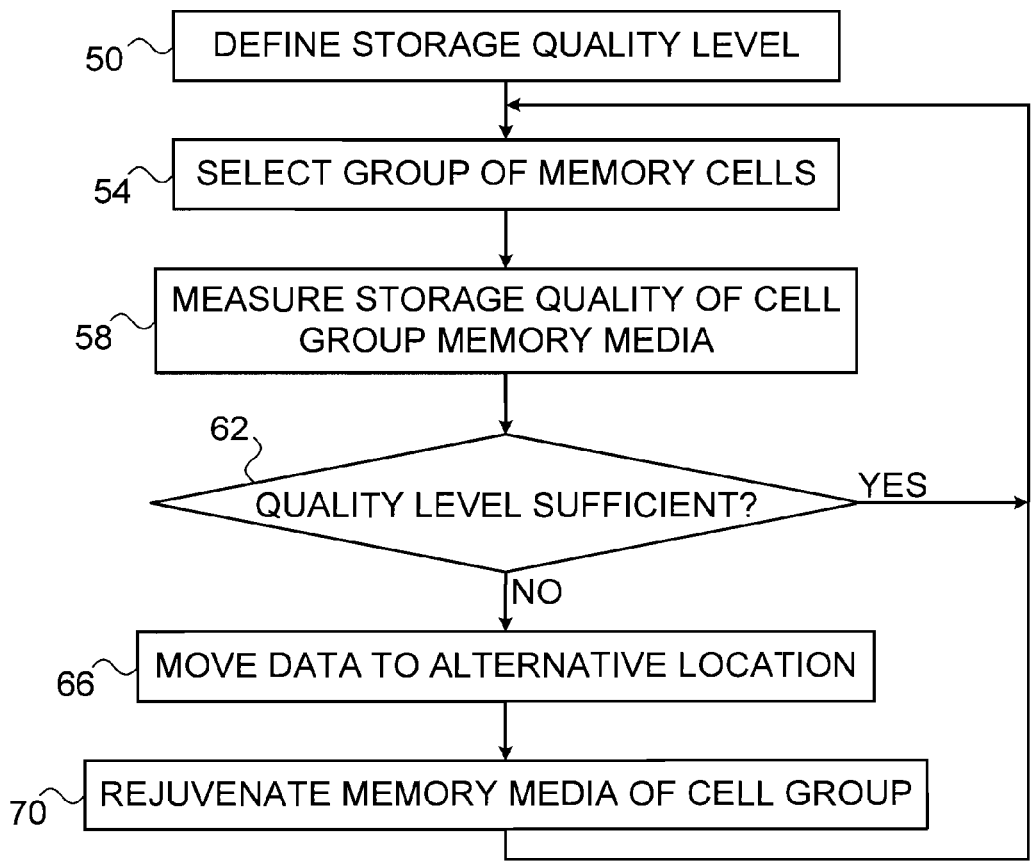
FIG. 2 is a flow chart that schematically illustrates a method for rejuvenating analog memory cells, in accordance with an embodiment of the present invention.

FIG. 2 is a flow chart that schematically illustrates a method for rejuvenating analog memory cells, in accordance with an embodiment of the present invention. The method begins by defining a certain storage quality level as tolerable, at a quality definition step 50. As noted above, the storage quality characterizes the physical memory media of the memory cells, and not the analog values or data that may or may not be stored in the memory cells.

Various criteria and conditions can be defined for deciding whether a group of memory cells has an intolerable storage quality, and should therefore be rejuvenated. For example, a memory block may be regarded a candidate for rejuvenation if the shift in the distribution of the cells' analog storage values (e.g., threshold voltages) over a predefined time period exceeds a certain tolerable level. As another example, a memory block may be regarded a candidate for rejuvenation if it fails to erase properly. A memory block may be regarded as faulty, for example, following a single erase failure, following a given number of consecutive erase failures, or following M erase failure out of N attempts. As another example, a group of memory cells (e.g., a memory block or page) may be regarded as having insufficient storage quality if it fails to program correctly, e.g., following a single programming attempt, several programming attempts, or M programming failures out of N attempts.

As yet another example, a group of memory cells can be regarded as a candidate for rejuvenation if a high number of read errors are encountered when reading data from this group. In an example embodiment, the memory controller may run a background task that reads pages from various memory blocks according to a certain pattern (e.g., reads the Nth page from each block, and later the N+1th page from each block, etc., or reads randomly-selected pages from the blocks). The memory controller may alternatively read parts of pages (e.g., sectors), read from only a subset of the blocks, or read different pages from different blocks. For each read operation, the memory controller applies ECC decoding, and counts the number of errors corrected in each page. Based on the numbers of corrected errors, the memory controller assesses the health status of each memory block.

Alternatively, any other suitable quality level or criterion can be used. The storage quality is also sometimes referred to as the health level of the memory cell group.

Memory controller 32 selects a certain group of memory cells, such as a memory block, a memory die or a packaged multi-die memory device, at a group selection step 54. The memory controller assesses the storage quality of the selected cell group, at a quality assessment step 58. For example, the memory controller may attempt to erase or program some or all of the memory cells in the group in order to assess whether the selected cell group is functional or faulty.

As another example, the memory controller may test a given group of memory cells by programming the memory cells, reading the memory cells after a predefined time period, and measuring the shift that developed in the distribution of the cells' analog storage values (e.g., threshold voltages) during this time period. If the shift is larger than a certain tolerable value, the controller may select this memory cell group as a candidate for rejuvenation. When using this technique, the memory controller may program the memory cells in the group with dummy data, or with user data as part of the normal storage process.

As can be appreciated, when the memory controller applies the above-described technique, it should refrain from programming or erasing the cell group in question during the predefined time period. In some applications, however, the data in this cell group needs to be updated or erased frequently. Thus, in some embodiments the memory controller first copies the data from the group to another memory location before testing it. When the group comprises a memory block, for example, the memory controller may copy the block content to another block, remove the block temporarily from the pool of available blocks, and then apply the above-described quality testing process. Based on the testing result, the memory controller can decide whether to return the block to the pool of available blocks or rejuvenate it.

Memory controller 32 checks whether the assessed storage quality of the selected cell group meets the tolerable quality level defined at step 50 above, at a checking step 62. If the storage quality is sufficient, the method loops back to step 54, in which the memory controller selects another group of memory cells for evaluation.

If, on the other hand, the assessed storage quality is insufficient, the memory controller initiates a rejuvenation process, which improves the storage quality of the physical media of the memory cells in the group. Several examples of rejuvenation processes are described further below. In some embodiments, the memory controller moves data that is stored in the cell group to an alternative location before rejuvenation, at a copying step 66. The memory controller may move the data, for example, to another block, die or memory device. In a system that includes multiple disks (e.g., multiple SSDs in a redundant RAID configuration) the memory controller may move the data to a different SSD. Once the data is copied to the alternative location, the memory controller rejuvenates the physical media of the cell group in question, at a rejuvenation step 70. In alternative embodiments, the data stored in the cell group is not copied to another location. Instead, the memory controller refreshes the stored data in-place in order to prevent data loss. An example method of this sort is described in FIG. 5 below.

Once the group of memory cells is rejuvenated, it remains in service. In other words, memory controller 32 permits subsequent data storage in this cell group. The method loops back to step 54 above, and the memory controller selects another cell group for evaluation.

In some embodiments, memory controller 32 rejuvenates a group of memory cells by inhibiting programming of the memory cells in the group for a certain time period. In Flash devices, refraining from programming the memory cells for a certain time period causes spontaneous de-trapping of electrons from the inter-cell oxide and/or bottom oxide, and therefore reduces the degradation of the physical memory media and improves the storage quality of the memory cells. In some practical cases, refraining from programming the memory cells for a period of between forty-eight hours and one week causes sufficient charge de-trapping, although any other suitable time period can also be used.

In alternative embodiments, the memory controller may rejuvenate a group of memory cells that was previously declared as faulty by re-attempting to use (erase or program) the group. These attempts may be conducted periodically, for example, or in response to events such as power-up.

Further alternatively, the memory controller may rejuvenate a group of memory cells by applying heating to the memory cells in the group. Heating the memory cells increases the likelihood (and rate) of charge de-trapping, and therefore considerably improves the storage quality of the memory cells' physical memory media. In some practical cases, heating the memory cells to a temperature on the order of 125° C. for a period of three hours causes sufficient charge de-trapping, although any other suitable temperature and heating period can also be used. As can be appreciated, heating the memory cells shortens the rejuvenation period considerably, in comparison with techniques that only inhibit programming of the memory cells. Typically, some of the physical media deterioration is irrecoverable, and therefore rejuvenation cannot be applied infinitely. Nevertheless, the rate of degradation can be reduced considerably, thus providing a significant lifetime extension. The memory system may comprise various means for applying heat to groups of memory cells.

Figure 3:
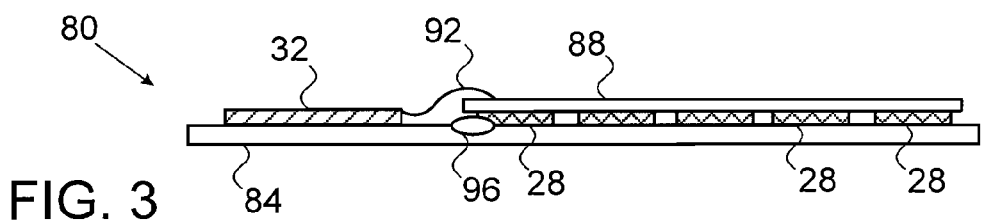
FIGS. 3 and 4 are schematic, pictorial illustrations of memory systems that employ memory device heating, in accordance with embodiments of the present invention.

FIG. 3 is a schematic, pictorial illustration of a memory system 80 that employs memory device heating, in accordance with an embodiment of the present invention. In system 80, memory controller 32 and multiple memory devices 28 are assembled on a printed circuit board 84. System 80 comprises a heating plate 88, which is laid over some or all of memory devices 28. The heating plate may comprise, for example, a thermocouple plate or any other suitable type of heat source. Heating plate 88 is controlled by memory controller 32 via an interface 92.

In some embodiments, system 80 comprises a temperature sensor 96 that is mounted in the vicinity of memory devices 28. The temperature sensed by sensor 96 is read by the memory controller. In some embodiments, the memory controller can implement a closed loop that maintains the memory devices at the appropriate temperature during the rejuvenation period. Alternatively, memory controller 32 may operate heating plate 88 in open loop. The memory controller may disconnect power supply from the memory devices prior to heating. In some embodiments, once the rejuvenation cycle is completed, the memory controller tests the memory devices in order to verify whether rejuvenation was successful.

Figure 4:
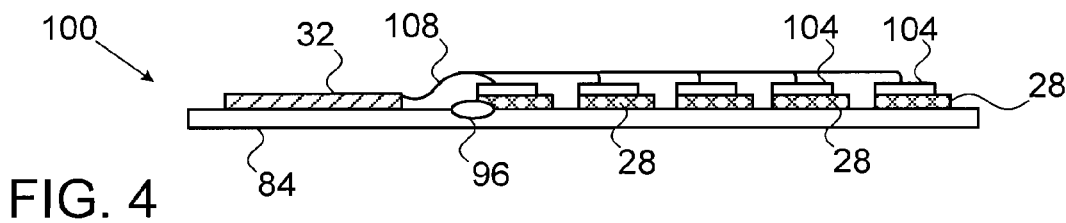

FIG. 4 is a schematic, pictorial illustration of a memory system 100 that employs memory device heating, in accordance with an alternative embodiment of the present invention. Unlike system 80 of FIG. 3, in which heating is applied indiscriminately to multiple memory devices 28, in system 100 memory controller 32 applies heating selectively to individual memory devices 28. System 100 comprises multiple local heating devices 108, each heating device attached to a respective memory device 28. Memory controller 32 can control each heating device 104 individually using an interface 108, so as to apply heating selectively to only some of the memory devices.

Heating devices 104 may comprise, for example, thermocouple heaters, polyimide heaters, silicon heaters, mica heaters, or any other suitable heater type. Each heating device 104 typically applies heat on the order of several watts locally to a given memory device 28. Devices 104 can be attached to memory devices 28 using any suitable means, such as by gluing. In some embodiments, the memory controller disconnects the power supply from a given memory device before activating the corresponding heating device.

In alternative embodiments, memory controller 32 can apply heat to a given group of memory cells by performing a stream of memory access operations (e.g., read or write operations) on the cell group in question or on a neighboring cell group. This technique is particularly suitable for applying heat to specific word lines (rows of memory cells within a block) or to an entire memory block.

Further alternatively, the system can heat memory devices using the self-heating of system components. In an example embodiment, the memory devices can be heated by preventing heat removal from the memory devices. For example, airflow over the memory devices and/or heat dissipation from the memory devices can be blocked in order to increase the device temperatures. As another example, the system can heat the memory devices by directing heat to these devices from other system components (e.g., from a Central Processing Unit—CPU). Further additionally or alternatively, the memory system may use any other suitable technique for applying heat to the memory cell groups in order to rejuvenate the memory cell physical media.

In some embodiments, memory controller 32 rejuvenates a given group of memory cells by heating, but does not first copy the data from the cell group to another cell group that is not being heated. In this scenario, data errors may develop relatively quickly because of the high temperature. For example, the rate at which the threshold voltages of NAND cells drift increases with temperature. Therefore, heating the memory cells for a long time period may cause considerable threshold voltage drift and potential read errors. In order to prevent data loss, memory controller 32 refreshes the programming of the memory cells in the group at a relatively high rate during the heating period. This refreshing process is typically carried out by applying one or more programming pulses to the memory cells, in order to compensate for the threshold voltage drift. In the description that follows, the memory controller refreshes the programming of the memory cells in-place, i.e., without copying the data to another location. In alternative embodiments, however, the memory controller refreshes the programming of the memory cells by copying the data to another group of memory cells (which is being heated, as well).

Figure 5:
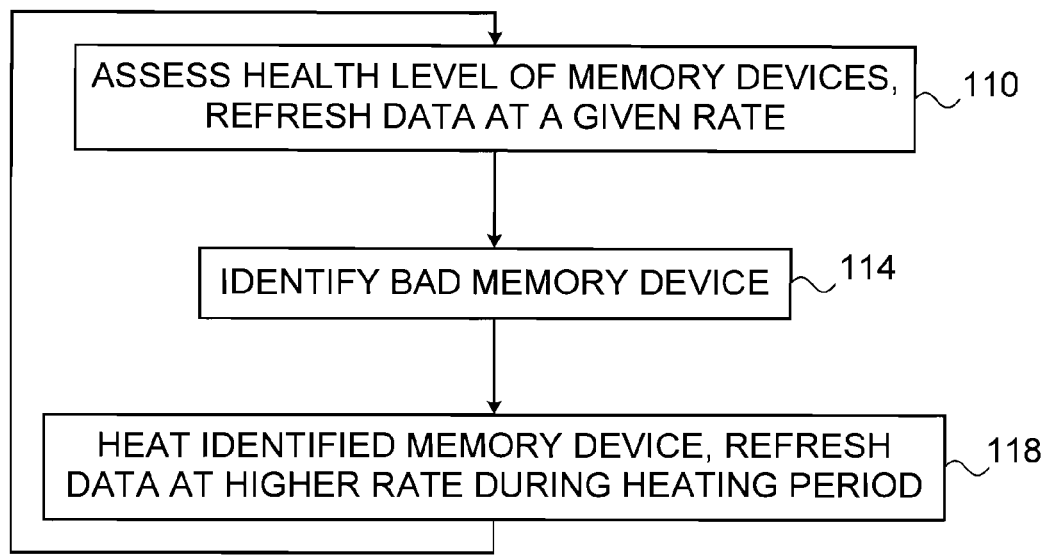
FIG. 5 is a flow chart that schematically illustrates a method for rejuvenation and in-place data refreshing of analog memory cells, in accordance with an embodiment of the present invention.

FIG. 5 is a flow chart that schematically illustrates a method for rejuvenation and in-place data refreshing of analog memory cells, in accordance with an embodiment of the present invention. The method begins with memory controller 32 assessing the health levels (storage qualities) of memory devices 28, at a health assessment step 120. During this time, the memory controller may refresh the programming of the memory devices at a certain nominal rate, which is suitable for typical threshold voltage drifts that develop during normal operation.

At some stage, memory controller 32 identifies a faulty memory device that is to be rejuvenated, at a fault identification step 114. The memory controller applies heat to the identified memory device, at a heating rejuvenation step 118. Any suitable heating scheme, such as the schemes of FIGS. 3 and 4 above, can be used for this purpose. During the heating period, the threshold voltages of the memory cells in the heated memory device drift at a higher rate than the normal rate, because of the high device temperature. Therefore, memory controller 32 refreshes the programming of the memory cells in the heated memory device at a rate that is higher than the nominal refresh rate used at step 110 above. As noted above, refreshing may be performed in-place or by copying the data to another location in the heated memory device.

When applying any of the rejuvenation techniques described herein, the memory controller may use any suitable management scheme and/or data structures for tracking the health level of memory cell groups and/or for selecting cell groups for rejuvenation. For example, the memory controller may hold a data structure that records the assessed health level of each cells group (e.g., of each memory block, memory die, packaged memory device or multi-device memory assembly such as SSD). In particular, such a data structure may hold the status/condition, endurance and usage of each cell group.

In some embodiments, the health-related information may be soft rather than binary. For example, the memory controller may record whether a programming attempt failed completely, or whether the programmed levels deviated from the desired levels only slightly. As another example, when a group of memory cells failed to erase properly, the memory controller may record the distance between the erased values of the memory cells from the specified erase threshold.

The memory controller may initiate rejuvenation of a given cell group when a given cell group is found to be faulty, or when the group's health level reaches a certain end-of-life condition. Selection of cell groups for rejuvenation may be carried out, for example, by a background task whose priority is lower than that of memory access operations. The background process can be repeated periodically, e.g., every few hours or days, or in response to a certain condition or event such as a level of memory access activity or power metric.

In some embodiments, when the memory controller intends to rejuvenate a given cell group, it notifies higher levels (e.g., an operating system or host) that this cell group is unavailable, and then proceeds with rejuvenation.

In some embodiments, when a certain cell group (e.g., die) is found to be faulty, the memory controller moves the data stored in this group to alternative memory locations, and adds the faulty cell group to a list or pool of faulty groups. Copying can be performed, for example, by mapping the logical addresses of the data items stored in the faulty group to new physical addresses. At a later time, e.g., using a background task, the memory controller selects cell groups from this list or pool and attempts to rejuvenate them. If rejuvenation of a given cell group is successful, the rejuvenated cell group is removed from the list or pool of faulty groups. Higher layers may be notified that the cell group in question is operational.

Some of the disclosed techniques consume considerable amounts of power (e.g., heating) and/or computational and bandwidth resources (e.g., refreshing). In these embodiments, rejuvenation is typically performed at relatively large intervals. For example, rejuvenation of faulty SSDs (or of individual memory devices in a SSD) can be performed during scheduled system maintenance periods. In these embodiments, rejuvenation can be performed using external heating means.

In some embodiments, memory controller 32 rejuvenates each memory device 28 when the memory device reaches a certain level of use, e.g., a certain number of Programming and Erasure (P/E) cycles. Typically, however, the memory device should avoid rejuvenating a large number of memory devices at the same time. In an example embodiment, the memory controller rejuvenates different memory devices when they reach different numbers of P/E cycles. For example, the memory device may assign each memory device a number of P/E cycles in the range 9000-11000, and rejuvenate each memory device when it reaches its designated number of P/E cycles.

Rejuvenation Based on Prediction of Future Health Level of Memory Cell Groups In some embodiments, memory controller 32 attempts to rejuvenate a group of memory cells whose current storage quality is still acceptable, but is predicted to deteriorate below the acceptable level shortly. Thus, in some embodiments the memory controller predicts the future health level of a memory cell group based on characteristics that are currently observable, and rejuvenates the memory cell group is the predicted storage quality is too low.

Figure 6:
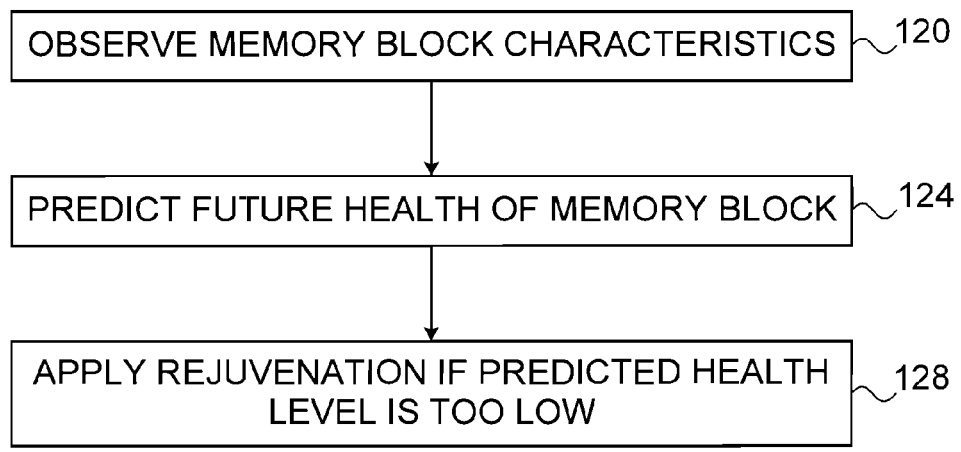
FIG. 6 is a flow chart that schematically illustrates a method for rejuvenating analog memory cells, in accordance with an alternative embodiment of the present invention.

FIG. 6 is a flow chart that schematically illustrates a method for rejuvenating analog memory cells, in accordance with an alternative embodiment of the present invention. The description that follows refers to a memory block, although the method is equally applicable to various other groups of memory cells.

The method begins with memory controller 32 observing characteristics of a given memory block, at a current observation step 120. Based on the observed characteristics, the memory controller predicts the future health level of the block, at a prediction step 124. If the predicted health level is insufficient (e.g., lower than a predefined threshold), the memory controller rejuvenates the memory block, at a block rejuvenation step 128. Any of the rejuvenation techniques described herein can be used.

Memory controller 32 may use any suitable method for predicting the future health level of the memory block. In some embodiments, the memory controller calculates a metric denoted TM, which estimates an integral of the operating temperature of the block over time. The metric is thus given by $TM=\int T(t)dt$, wherein $T(t)$ denotes the temperature of the memory block at time t. In a discrete-time implementation, the memory controller measures the temperature at t0-second intervals, and the integral is estimated by $TM=\Sigma P(t-t0)t0$.

The memory controller may estimate $T(t)$, for example, by directly measuring the temperature in the vicinity of the memory block. The memory controller may use the readings of temperature sensor 96 of FIGS. 3 and 4 for this purpose. Alternatively, the memory controller may estimate $T(t)$ indirectly by sensing the electrical current that is consumed locally in the block, assuming that the device temperature is dependent on its power consumption. In some embodiments, the memory controller comprises a global timer for performing time measurements. In these embodiments, the memory controller can collect multiple time-temperature data points in order to compute the metric. The integration period is typically from the last programming operation until the present time, although other integration periods can also be used.

The memory controller then estimates the health level of the block based on the above-described TM metric. For example, the metric value is typically indicative of the threshold voltage drift that is expected in the block. If the memory controller measures a drift that is considerably different (typically faster) than the expected drift, the block may be assumed to have poor health condition. Such cells may be regarded as candidates for rejuvenation.

The temperature integral metric TM described above provides an accurate measure of the threshold voltage shift in the memory cells, considering the actual temperature at which the memory cells operate. As such, this metric can be used for various other purposes, which do not necessarily involve rejuvenation of memory cells.

For example, the memory controller may estimate TM for a certain group of memory cells, and then adjust the read thresholds that are used for reading data from the memory cells in the group based on the estimated TM value. The memory controller can then read the threshold voltages of the memory cells in the group using the adjusted read thresholds, so as to reconstruct the data stored in the cells. Since the optimal read threshold positions typically depend on the threshold voltage shift that develops in the memory cells, this technique enables accurate read threshold adaptation.

In some embodiments, the health level of a group of memory cells can be estimated based on statistical properties of the analog values (e.g., threshold voltages) stored in the cells. The description that follows refers to memory pages, although the disclosed techniques can be used with various other groups of memory cells. In these techniques, statistical properties of the cells' threshold voltages at a given measurement time are used for estimating the number of read errors this cell group will have at a certain future time. The future time can be defined, for example, as the given measurement time, plus a certain number of P/E cycles, plus a certain retention period. Alternatively, any other suitable definition of the future time can also be used.

In an example embodiment, the following statistical properties are evaluated a-priori:
- An empirical covariance between the current number of errors in a page (i.e., at the measurement time) and the number of errors in the page at the future time.
- An empirical mean of the current number of errors in a page, at the measurement time.
- An empirical mean of the number of errors in a page at the future time.
- An empirical variance of the current number of errors in a page, at the measurement time.

These properties can be evaluated, for example, by reading the cell threshold voltages and counting errors over a large number of sample memory blocks. During operation, the memory controller can use these properties to estimate the number of errors a particular page is expected to have at the future time. In an embodiment, the expected future-time number of errors is estimated by:

$$FutureTimeErrors = E\{FutureTimeErrors\} + \frac{\text{Cov}(FutureTimeErrors, MeasurementTime \text{ Errors})}{\text{Var}(MeasurementTime \text{ Errors})} \cdot (MeasurementTime \text{ errors} - E\{MeasurementTime \text{ errors}\})$$

Typically, the memory controller stores the relationship between the number of errors at the present measurement time and the predicted number of errors at the future time, such as in one or more tables. The tables may hold relationships for several future time points. Using this information, the memory controller may estimate the number of errors that a given page is expected to have at the future time point, and decide whether or not to rejuvenate it based on the predicted number of errors.

In an alternative embodiment, the number of future-time errors in a page is estimated based on the width of the threshold voltage distribution of the cells associated with a given programming level. In this context, the width of a given programming level is defined as the size of the threshold voltage interval, which includes a certain percentage (e.g., 99.7%) of the threshold voltages of the cells programmed to that programming level.

In an example embodiment, a correlation coefficient between the width of the programming level and the number of errors the page will have at the future time point is estimated for each programming level in a page. The correlation coefficient of the $i^{th}$ programming level is given by:

$$\rho_i = \frac{\text{Cov}(\text{width of level } i, FutureTimeErrors)}{\sqrt{\text{Var}(\text{width of level } i) \cdot \text{Var}(FutureTimeErrors)}}$$

Typically, the programming level having the largest correlation coefficient is chosen, and the number of future-time errors is estimated from the width of this programming level at measurement time. The empirical variances and covariance in the above equation can be estimated, for example, by reading the cell threshold voltages and counting errors over a large number of sample memory blocks. The memory controller typically stores the relationship between the preset distribution width and the predicted number of errors at the future time point, e.g., in one or more tables. During operation, the memory controller uses these relationships to estimate the number of errors a particular page is expected to have at the future time point. In an embodiment, the expected future-time number of errors is estimated by:

$$FutureTimeErrors = E\{FutureTimeErrors\} + \frac{\text{Cov}(FuturTimeErrors, \text{level width})}{\text{Var}(\text{level width})} \cdot (\text{level width} - E\{\text{level width}\})$$

In many practical cases, the number of errors in a page has is affected by both the shapes and the widths of the programming levels' threshold voltage distributions. In the early stages of the memory cells' operation, the number of errors is often more correlated with the shapes of the distributions than with their widths, because long distribution tails are often responsible for start-of-life errors. The widths of the distributions at the future time point are typically correlated with the widths of the respective distributions in earlier life stages. The number of errors at the future time point is typically highly correlated with the distribution widths at end-of-life. Because of these typical relationships, it is often advantageous to estimate the number of future-time errors in a given page based on (1) the widths of the programming level distributions in the page, and (2) the number of errors in the page at measurement time.

Thus, in some embodiments, the memory controller estimates the number of future-time errors in a given page (and therefore the health level of the page) by:

$$FutureTimeErrors = E\{FutureTimeErrors\} + Cxy \cdot Cyy^{-1} \cdot (Y - E\{Y\})$$

wherein $$Y = \begin{bmatrix} \text{levels width at Measurement Time} \\ \text{Measurement Time Errors} \end{bmatrix}$$

$$Cxy = \begin{bmatrix} \text{Cov}(\text{level width}, FutureTimeErrors) \\ \text{Cov}(\text{Measurement Time Errors}, FutureTimeErrors) \end{bmatrix}$$

$$Cyy = \begin{bmatrix} \text{Var}(\text{level width}) & \text{Cov}(\text{level width, Measurement Time Errors}) \\ \text{Cov}(\text{level width, Measurement Time Errors}) & \text{Var}(\text{Measurement Time Errors}) \end{bmatrix}$$

Constant Heating of Memory Devices

In some embodiments, system 20 can apply heat to one or more memory devices, without explicitly identifying certain memory cell groups as requiring rejuvenation. Constant heating of memory cells is advantageous in many practical scenarios, since it rejuvenates the physical media of the memory. In floating-Gate Flash devices, for example, constant heating increases the rate of charge de-trapping from tunnel oxide.

During operation of system 20, each memory device generates internal heat during its operation. The term "internal heat" refers to heat that is generated by the memory device circuitry during operation, i.e., heat that originates from the electrical power consumed by the memory circuitry. In some embodiments, system 20 applies to one or more of the memory devices external heat, in addition to the internal heat generated by the memory devices. The external heat increases the operating temperature of the memory devices, and causes accelerated charge de-trapping. As a result, the performance of the memory cells is improved. The operating temperature is increased by the external heat, but typically remains within the operating temperature range specified for the devices. For example, an increased temperature on the order of 80-90° C., or any other suitable temperature, can be used.

System 20 may use any suitable mechanism for applying external heat to the memory devices. For example, the system may use various types of heaters coupled to the memory devices, direct heat from other system components, or use any of the heating schemes described in this application. Note that a heater fitted inside the memory device package is still considered a source of external heat, since its heat does not originate from the memory circuitry. Heating may be performed in open-loop or in closed-loop. Heating may be performed continuously or at periodic time intervals. In some embodiments, the system increases the rate at which the data stored in the heated cells is refreshed, in order to compensate for the accelerated threshold voltage drift caused by the heating (as described, for example, in FIG. 5 above).

Although the embodiments described herein mainly address rejuvenation of non-volatile solid-state memory cells, the methods and systems described herein can also be used for memory cell rejuvenation in other memory and physical media types, such as in Random Access Memory (RAM) and/or in magnetic Hard Disk Drives (HDD).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
   programming a given group of analog memory cells;
   after programming memory cells in the group, inhibiting subsequent programming of the memory cells in the group for a given time interval;
   reading the memory cells in the group at a beginning of the given time interval to produce a pre-interval readout result; and
   reading the memory cells in the group at an end of the given time interval to produce a post-interval readout result;
   assessing a storage quality level of the physical media of the memory cells in the group by comparing a difference between the pre-interval and post-interval readout results with a defined tolerable difference; and
   managing data storage in the group of the memory cells responsively to the assessed storage quality level.

2. The method according to claim 1, wherein inhibiting the subsequent programming includes removing the group from a list of the memory cells that are available for programming, and wherein managing the data storage includes conditionally returning the group to the list based on the assessed storage quality level.

3. The method of claim 1, wherein the managing data storage includes indicating that the memory cells in the group are faulty in response to determining that the difference between the pre-interval and post-interval reading results is greater than the defined tolerable difference.

4. The method of claim 1, wherein the managing data storage includes initiating, in response to determining that the difference between the pre-interval and post-interval reading results is greater than the defined tolerable difference, a rejuvenation of the memory cells in the group that causes the memory cells to meet a particular storage quality level.

5. The method of claim 1, further comprising copying data from the cells in the group to another memory location before programming the memory cells in the group.

6. The method of claim 1, wherein the programming includes erasing the given group.

7. The method of claim 1, wherein the programming includes programming respective predetermined storage values to the memory cells in the group.

8. The method of claim 1, wherein the given group of the memory cells is an erasure block.

9. An apparatus, comprising:
   an interface configured to communicate with a memory that includes multiple analog memory cells; and
   circuitry, configured to:
     program a given group of the memory cells;
     read the memory cells in the group to produce a pre-interval readout result;
     inhibit subsequent programming of the memory cells in the group for a given time interval after programming of the memory cells in the group;
     read the memory cells in the group at an end of the given time interval to produce a post-interval readout result; and
     assess a storage quality level of the physical media of the memory cells in the group by comparing a difference between the pre-interval and post-interval readout results with a defined tolerable difference.

10. The apparatus according to claim 9, wherein the circuitry is configured to inhibit the subsequent programming by removing the group from a list of the memory cells that are available for programming, and to conditionally return the group to the list responsively to the assessed storage quality level.

11. The apparatus of claim 9, wherein the circuitry is further configured to initiate, in response to determining that the difference between the pre-interval and post-interval reading results is greater than the defined tolerable difference, a rejuvenation of the memory cells in the group that causes the memory cells to meet a particular storage quality level.

12. The apparatus of claim 9, wherein the circuitry is further configured to copy data from the cells in the group to another memory location before programming the memory cells in the group.

13. The apparatus of claim 9, wherein the given group of the memory cells is an erasure block.

14. A computer-readable storage medium, having instructions stored thereon that are executable by a computer system to perform operations including:
   programming a group of analog memory cells;
   after programming the memory cells in the group, inhibiting subsequent programming of the memory cells in the group for a given time interval;
   assessing a storage quality level of the physical media of the memory cells in the group by estimating a threshold voltage shift that develops in the memory cells in the group during the given time interval;
   comparing the threshold voltage shift to a defined tolerable voltage shift; and
   managing data storage in the group of the memory cells responsively to the assessed storage quality level.

15. The computer-readable storage medium of claim 14, wherein the managing data storage includes initiating, in response to determining that the threshold voltage shift is greater than the defined tolerable voltage shift, a rejuvenation of the memory cells in the group that causes the memory cells to meet a particular storage quality level.

16. The computer-readable storage medium of claim 14, wherein the instructions are further executable to perform copying data from the cells in the group to another memory location before programming the memory cells in the group.

17. The computer-readable storage medium of claim 14, wherein the programming includes programming respective predetermined storage values to the memory cells in the group.

18. The computer-readable storage medium of claim 14, wherein the given group of the memory cells is an erasure block.

* * * * *